(12) United States Patent
Mayuzumi

(10) Patent No.: US 8,047,887 B2
(45) Date of Patent: Nov. 1, 2011

(54) METHOD FOR PRODUCING AN ORGANIC EL DISPLAY

(75) Inventor: Yohei Mayuzumi, Tokyo (JP)

(73) Assignee: Nagase & Co., Ltd., Osaka (JP)

( * ) Notice: Subject to any disclaimer, the term of this patent is extended or adjusted under 35 U.S.C. 154(b) by 199 days.

(21) Appl. No.: 12/521,694

(22) PCT Filed: Apr. 2, 2008

(86) PCT No.: PCT/JP2008/056578
§ 371 (c)(1),
(2), (4) Date: Jun. 29, 2009

(87) PCT Pub. No.: WO2008/136235
PCT Pub. Date: Nov. 13, 2008

(65) Prior Publication Data
US 2010/0317251 A1    Dec. 16, 2010

(30) Foreign Application Priority Data
Apr. 27, 2007   (JP) .................. 2007-118496

(51) Int. Cl.
*H01J 9/26* (2006.01)
*H01J 1/62* (2006.01)

(52) U.S. Cl. ............ 445/25; 445/24; 313/504; 313/506; 313/512

(58) Field of Classification Search .......... 313/498–512; 445/24, 25
See application file for complete search history.

(56) References Cited

U.S. PATENT DOCUMENTS

| | | | |
|---|---|---|---|
| 2004/0259326 A1* | 12/2004 | Hideo | 438/458 |
| 2005/0057151 A1* | 3/2005 | Kuwabara | 313/506 |
| 2005/0095736 A1* | 5/2005 | Padiyath et al. | 438/22 |
| 2006/0043889 A1* | 3/2006 | Kim et al. | 313/506 |

FOREIGN PATENT DOCUMENTS

| | | |
|---|---|---|
| JP | 08-213171 A | 8/1996 |
| JP | 2002-40964 A | 2/2002 |
| JP | 2004-191573 A | 7/2004 |

* cited by examiner

*Primary Examiner* — Bumsuk Won
(74) *Attorney, Agent, or Firm* — Muncy, Geissler, Olds & Lowe, PLLC

(57) ABSTRACT

A production method for an organic EL display comprises sticking an anti-static sheet 2 onto the first main surface of a glass substrate 11 on which a metal hat 13 is formed and etching the second main surface 11c of the glass substrate 11 stuck with the anti-static sheet 2.

7 Claims, 4 Drawing Sheets

METHOD FOR PRODUCING AN ORGANIC EL DISPLAY

TECHNICAL FIELD

The present invention relates to a method for producing an organic EL (Electro-Luminescence) display.

BACKGROUND ART

An organic EL display has features that the simplification of a drive circuit can be achieved because of being driven by a direct current voltage, dependency of viewing angle like a liquid crystal display can be reduced, and a bright image can be obtained owing to self luminescence. Furthermore, because of having an advantage of fast response time or speed, the organic EL display is paid to attention as a flat display panel.

In a producing method of such kind of the organic EL display, anodes, organic films, and cathodes are firstly laminated using a vapor deposition on a transparent electrode glass as a glass substrate thereby forming organic EL elements and wiring patterns. Next, each of the organic EL elements formed on the transparent electrode glass is covered by a metal cap (protecting plate or protecting member) formed of SUS, Al and so forth, and the metal caps are fixed adhesively on the transparent electrode glass. Finally, the transparent electrode glass is divided with each organic EL element, thereby producing organic EL displays (refer to Patent Document 1).

Incidentally, in order to reduce the thickness of the organic EL display, a method of etching is adopted in which the glass substrate as a transparent substrate is etched using an etching liquid, such as a hydrofluoric acid solution.

However, there is a fear that the metal cap corrodes when the metal cap is immersed into the etching liquid. On the other hand, in case that a masking sheet is adopted to mask a main surface of the glass substrate to which the etching is unnecessary in order to protect the metal cap from corrosion due to the etching liquid, there are fears that the wiring patterns might be damaged by being contacted with the masking sheet, and static electricity charged in the masking sheet causes adverse effects on the organic EL elements.

[Patent Document 1] Japanese Patent Gazette No. 3,626,728

DISCLOSURE OF INVENTION

Object of the present invention is to prevent corrosion of a protecting member or plate which protects an organic EL element and to prevent damage of the organic EL element caused from static electricity.

The present invention provides a method for producing an organic EL display. The method comprises providing one or more organic EL element(s) on a transparent substrate by laminating an anode, a luminescence function layer formed by an organic substance, and a cathode, the transparent substrate having a first main surface and a second main surface, the organic EL element being formed on the first main surface, and providing a protecting member adhesively on the first main surface of the transparent substrate so that the protecting member hermetically seals the organic EL element with the first main surface.

The present invention is characterized in that the method further comprises sticking an anti-static sheet on the transparent substrate so that the anti-static sheet conceals the first main surface of the transparent substrate and the protecting member, etching the second surface of the transparent substrate stuck with the anti-static sheet, and taking off the anti-static sheet.

According to the present invention, the anti-static sheet is stuck on the transparent substrate so that the anti-static sheet conceals the first main surface of the transparent substrate and the protecting member, therefore corrosion of the protecting member by an etching liquid can be prevented and damage of the organic EL element caused from static electricity charged in a sheet can be prevented.

Figure 1A:
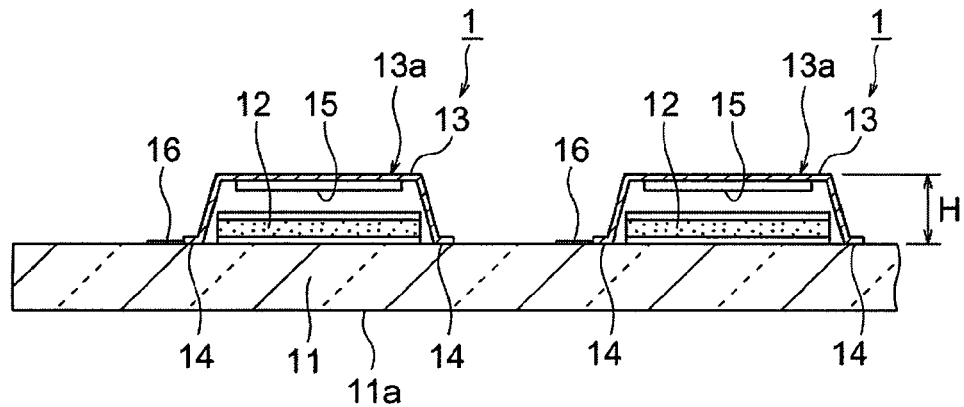
FIG. 1A is a cross-sectional view showing an embodiment of an organic EL display according to the present invention.

DESCRIPTION OF REFERENCE NUMERALS 1, 1A; organic EL display
11; glass substrate (transparent substrate)
12; organic EL element
13; metal cap or metal hat (protecting plate or protecting member)
13A; flat plate like protecting plate
14; adhesive
15; drying agent
16; terminal (wiring pattern)
2; anti-static sheet

BEST MODE FOR CARRYING OUT THE INVENTION

Hereinafter, embodiments of the present invention will be described with reference to the drawings.

Figure 1B:
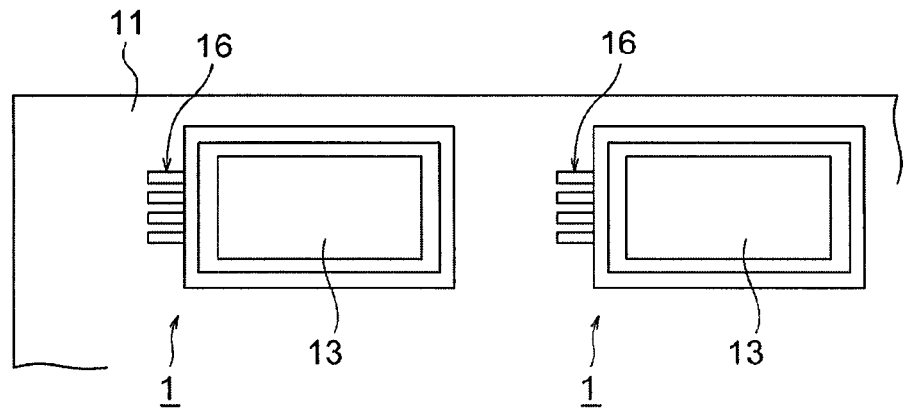
FIG. 1B is a plan view showing the embodiment of the organic EL display according to the present invention.

FIG. 1A is a cross-sectional view showing an embodiment of an organic EL display according to the present invention, and FIG. 1B is a plan view of the same. Shown in FIGS. 1A and 1B is a status in which a plurality of organic EL displays 1 are formed on a glass substrate 11 of large scale before the glass substrate 11 is divided into many pieces and after the glass substrate 11 is etched.

Regarding each organic EL display 1 according to the present embodiment, an organic EL element 12 is provided on the glass substrate 11 as a transparent substrate by laminating an anode, a luminescence function layer formed from a plurality of organic substances, and a cathode. Further, terminals 16 are formed on the glass substrate 11 so that the terminals 16 are electrically connected to the anode and the cathode, respectively, and to be connected to a driving circuit not shown. The terminals 16 can be provided on the surface of the glass substrate 11 as wiring patterns formed of conductive materials such as Cu by using a photo lithography method.

The organic EL element 12 should be cut off from water vapor, because the organic EL element 12 tends to be influenced from water vapor and the lifetime of the EL element 12 becomes short under the condition of higher water vapor atmosphere. Accordingly, a metal hat (metal cap) 13 as a protecting member is provided on the glass substrate 11 so that the metal hat 13 hermetically seals the organic EL element 12 with the surface (the first main surface) of the glass substrate 11 and cuts off water vapor.

The metal hat 13 is formed as a bowl shaped (cap-shaped or hat shaped) member having a top surface 13a of which the height H is approximately 0.5 mm. The metal hat 13 is made of metal material such as stainless steel and aluminum and is provided adhesively on the glass substrate 11 using an adhesive 14.

A dry agent 15 absorbing water vapor is provided on the inner surface of the metal hat 13 so that the dry agent 15 opposes the organic EL element 12 in the metal hat 13. Although the dry agent 15 is not essential, in order to make sure that water vapor in the metal hat 13 is absolutely removed, the dry agent 15 is adopted in the present embodiment because it is difficult to eliminate the possibility that extremely slight water vapor exists.

In case of displaying an image using the organic EL display 1, a direct current voltage is applied through the terminal 16 to a particular region causing to emit light. As a result, electrons are injected to the particular region i.e. the part of the organic EL element 12 where the direct current voltage is applied and an electric field is caused, the part of the organic EL element 12 emits light, and a color image is displayed on a display surface 11a.

An embodiment of producing method for the organic EL display 1 above will be hereinafter described with reference to FIGS. 2A to 2C.

Figure 2A:
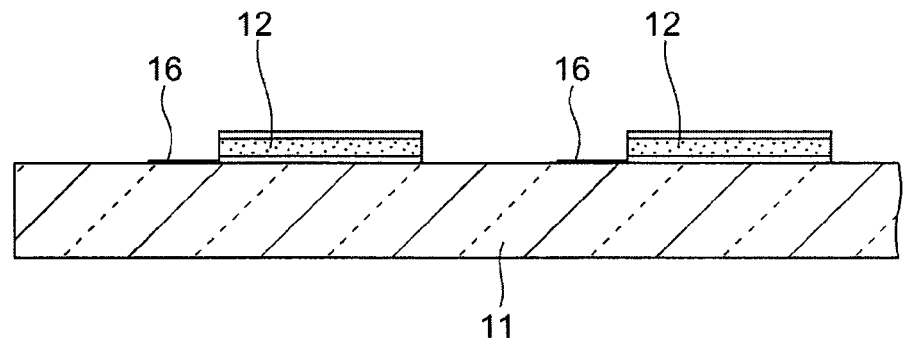
FIG. 2A is a cross-sectional view (part 1) showing an embodiment of a method for producing the organic EL display according to the present invention.

As shown in FIG. 2A, the organic EL elements 12 are firstly formed on the glass substrate 11 such as a large scale transparent electrode glass of 300 mm×400 mm by laminating anodes, organic films, and cathodes using a vapor deposition method in a nitrogen atmosphere in order to eliminate water vapor invasion. In the present embodiment, the plurality of organic EL elements 12 are regularly arranged on the transparent electrode glass 11.

Next, the dry agent 15 such as CaO is previously adhered to the inside of a top surface 13a of each metal hat 13.

Figure 2B:
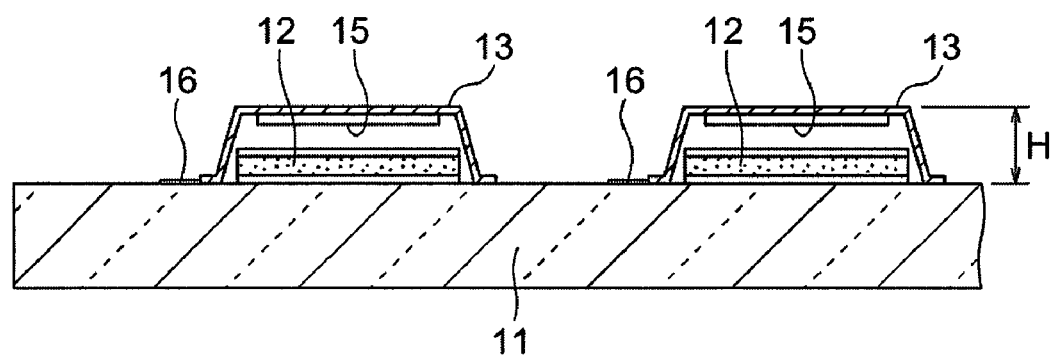
FIG. 2B is a cross-sectional view (part 2) showing the embodiment of the method for producing the organic EL display according to the present invention.

Then, as shown in FIG. 2B, the metal hat 13 to which the dry agent 15 is adhered is stuck onto the glass substrate 11 on which the organic EL elements 12 are provided, using the adhesive 14, so that the metal hat 13 hermetically seals each organic EL element 12. The adhesive 14 is appropriately selected by a person skilled in the art as an adhesive which is capable of adhering the metal hat to the glass substrate 11.

It should be noted that the anodes of the organic EL element 12 can be suitably formed from ITO (Indium Tin Oxide), or the anodes are previously provided on the glass substrate 11 then the organic EL element 12 can be obtained.

Figure 2C:
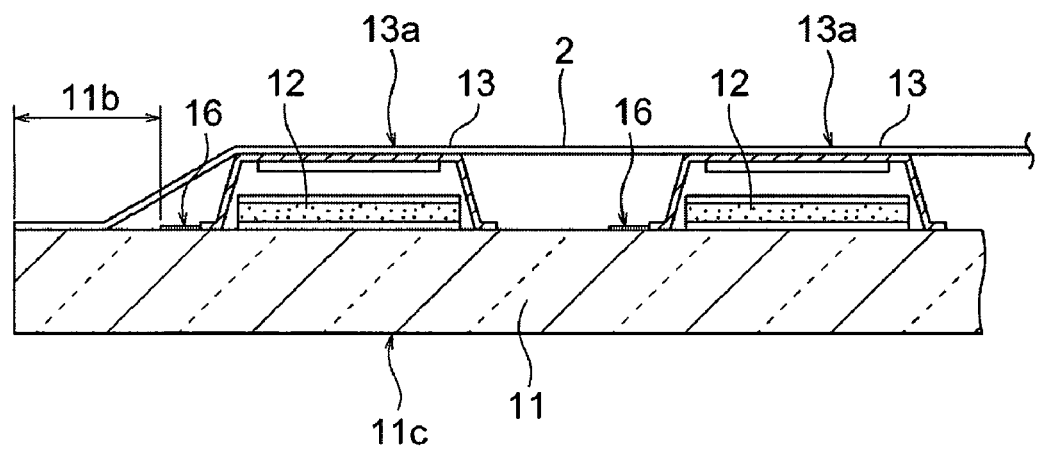
FIG. 2C is a cross-sectional view (part 3) showing the embodiment of the method for producing the organic EL display according to the present invention.
Figure 3:
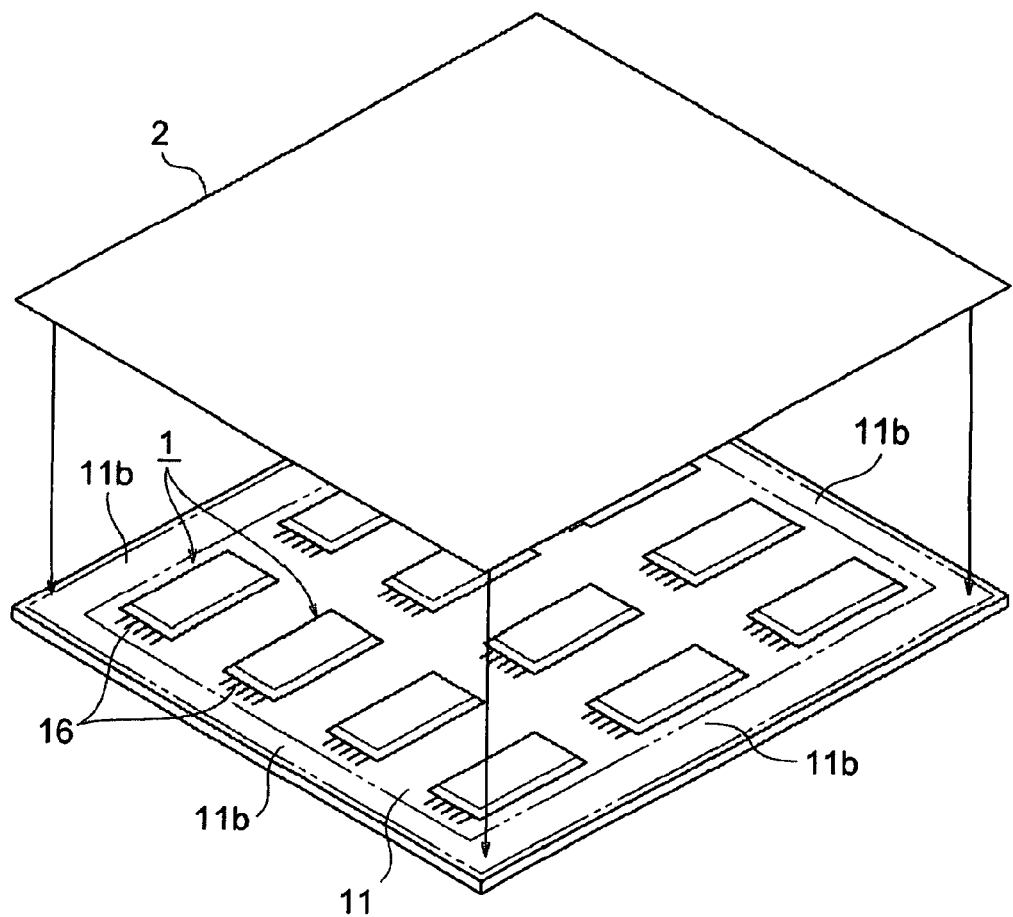
FIG. 3 is a perspective view showing the embodiment of the method for producing the organic EL display according to the present invention.

FIG. 3 is a perspective view showing an assembly which has the glass substrate 11 of large scale, and the organic EL elements 12 and the metal hats 13 covering the organic EL elements 12, respectively, regularly arranged in 3 columns×4 rows on the surface of the glass substrate 11. In order to obtain a thin and light-weight organic EL display, as shown in FIGS. 2C and 3, a surface 11c as the second main surface of the glass substrate 11 of large scale is etched by means of chemical etching using etching liquid of which main component is hydrofluoric acid.

The chemical etching is accomplished by immersing the glass substrate 11 of large scale into the etching liquid in the condition where the organic EL elements 12, the terminals 16 and the metal hats 13 is provided onto the glass substrate 11. Setting of the etching time is determined in accordance with the thickness of an organic EL display to be obtained finally.

However, the metal hats 13 and the terminals 16 formed of conductive materials can be caused to corrode by immersing into the etching liquid, such as hydrofluoric acid. In order to avoid the corrosion, an anti-static sheet 2 is stuck onto a main surface of the glass substrate 11, on which the organic EL elements 12 are formed, as shown in FIGS. 2C and 3.

Example of the anti-static sheet 2 preferably used herein comprises a polyethylene sheet (film) as a base sheet, an anti-static material formed from epoxy resin containing a conductive filler, which is coated on one or the other main surface of the polyethylene sheet, and an adhesive material formed from acrylic resin as a main component, which is coated on one or the other main surface of the polyethylene sheet.

The anti-static material can be coated on both of the main surfaces of the polyethylene sheet, or can be coated on one of the main surfaces. Further, the adhesive material can be coated on the main surface of the polyethylene sheet on which the anti-static material is coated, or can be coated on the main surface on which the anti-static material is absent.

A component of the anti-static material is not limited to the conductive filler. Alternatively, the anti-static material can contain powder composition or particulate composition having conductivity.

Such anti-static sheet 2 is adopted to protect from the etching liquid the metal hats 13 and the terminals 16 formed on the main surface (the first main surface) of the glass substrate 11. Accordingly, the anti-static sheet 2 is designed preferably such that the adhesive material presents sufficient adhesion, and the adhesive material causes no residual when the anti-static sheet 2 is taken off. In the present embodiment, the polyethylene sheet is used as the base sheet, because the polyethylene sheet can be preserved from deterioration in the etching liquid. Alternatively, another base sheet, such as a polypropylene sheet, can be adopted as having such characteristic, because the anti-static sheet 2 is used to protect from the etching liquid the metal hats 13 and the terminals 16 formed on the first main surface of the glass substrate 11.

The thickness of the anti-static sheet 2 is preferably chosen from 10-100 μm, further preferably 30-70 μm, in accordance with conditions, such as working efficiency of sticking and taking off of the anti-static sheet 2 and infiltration characteristic of the etching liquid into the anti-static sheet 2.

The anti-static sheet 2 is stuck on the glass substrate 11 under a pressure using a laminating pressure roller, not shown, in the situation where the surface of the anti-static sheet 2 on which the adhesive material is coated opposes the main surface (the first main surface) of the glass substrate 11 on which the metal hats 13 are provided and is laminated onto a peripheral portion 11b of the glass substrate 11.

Each of the metal hats 13 has a specific height H approximately 0.5 mm. Accordingly, the anti-static sheet 2 keeps contact with the peripheral portion 11b (a part of the first main surface) of the glass substrate 11, whereas the anti-static sheet 2 gets out of contact with the first main surface of the glass substrate 11 between adjacent each two of the metal hats 13 where the terminals 16 are formed, as shown in FIG. 2C. In other words, the anti-static sheet 2 is stuck on top surfaces 13a of the metal hats 13 so as to get out of contact with the terminals 16, excepting the peripheral portion 11b of the glass substrate 11. As a result, it can be possible to prevent damages of the terminals 16 in case of taking off the anti-static sheet 2, and to prevent contact failure causing from the residual of the adhesive material on the surface of the terminal.

It should be noted that the peripheral portion 11b of the glass substrate 11 is defined as an outer side region surrounding an inner side region of the glass substrate 11 of large scale where the metal hats 13 and the terminals 16 are provided, as shown in FIGS. 2C and 3.

After sticking the anti-static sheet 2 onto the main surface (the first main surface) of the glass substrate 11, the glass substrate 11 is immersed into the etching liquid thereby the chemical etching of the surface 11c (the second main surface) of the glass substrate 11 is accomplished. Alternatively, the chemical etching can be achieved by spraying the etching liquid onto the surface 11c of the glass substrate 11.

After finishing the prescribed chemical etching, the glass substrate 11 is pulled up from the etching liquid and dried, and the anti-static sheet is taken off. In this action, the anti-static material containing conductive substances is coated on the anti-static sheet 2, therefore charging of static electricity is suppressed, and damages of the organic EL elements caused from the static electricity and so forth are prevented, same as the case of sticking the anti-static sheet 2 onto the glass substrate 11 described above.

Finally, the glass substrate 11 on which a plurality of the organic EL elements 12, the terminals 16, and the metal hats 13 are arranged is divided into many pieces each having the organic EL display 1 using a scriber and so forth. A glass has a high formability in general, accordingly a large number of organic EL displays can be produced at a time, and it can be possible to increase productivity thereof.

In accordance with the above described embodiment of the present invention, the anti-static sheet 2 is used in operation of the etching for the surface 11c (the second main surface) of the glass substrate 11, it can be prevented that the static electricity flows through the organic EL element 12 when the anti-static sheet 2 is stuck or taken off.

Moreover, it can be suppressed that the terminals 16 are damaged and the adhesive material of the anti-static sheet 2 causes residual on the terminals 16 in case of taking off the anti-static sheet 2, because the anti-static sheet 2 is stuck on the glass substrate 11 so as to keep away from a region on which the terminals 16 are formed as much as possible.

Accordingly, thin and lightweight solution of the organic EL display 1 becomes possible wherein the organic EL element 12 and the terminals 16 escape from damages and the metal hats 13 and the terminals 16 are prevented from corrosion.

Figure 4:
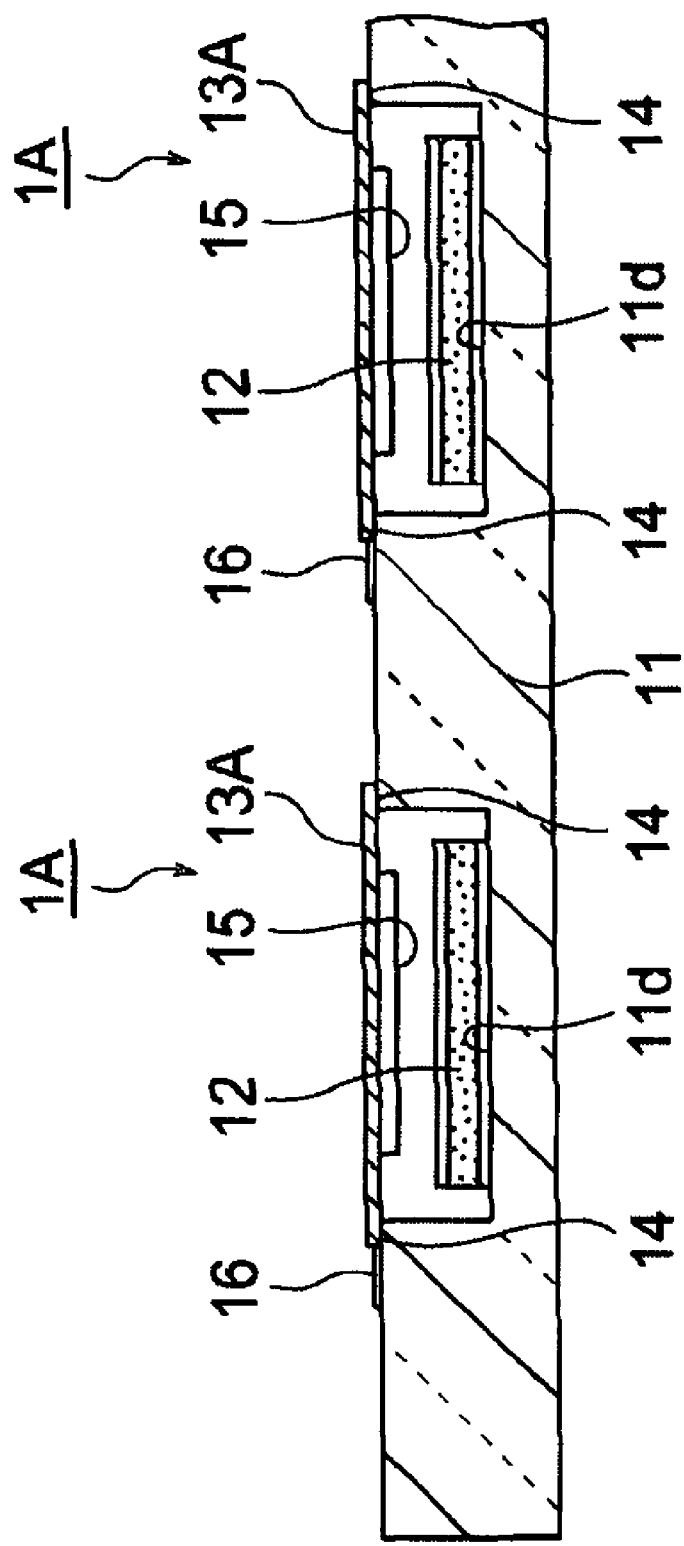
FIG. 4 is a cross-sectional view showing another embodiment of an organic EL display according to the present invention.

It should be noted that the protecting member hermetically sealing the organic EL element according to the present invention is not limited to the metal hat 13 in the above described embodiment, and a flat plate like protecting member can be adopted. For instance, as shown in FIG. 4, an organic EL display 1A can be obtained through the steps of forming concave portions 11d on the glass substrate 11 by method of etching and so forth, forming the organic EL element 12 and the terminals 16 for each concave portion 11d, and then adhering a flat plate like protecting plate 13A using the adhesive 14.

Furthermore, the present invention is not limited to the above described embodiment, where a plurality of the organic EL displays 1 are formed on the glass substrate 11 as the transparent substrate. A single organic EL display 1 may be formed on the glass substrate 11, the single organic EL display 1 is covered by the anti-static sheet 2, and then the etching is accomplished within the scope of the present invention.

The invention claimed is:

1. A method for producing an organic EL display, comprising;
    providing one or more organic EL element on a transparent substrate by laminating an anode, a luminescence function layer formed from an organic substance, and a cathode, said transparent substrate having a first main surface and a second main surface, said organic EL element being formed on the first main surface;
    providing a protecting member adhesively on the first main surface of the transparent substrate so that the protecting member hermetically seals the organic EL element with the first main surface;
    sticking an anti-static sheet on the transparent substrate so that the anti-static sheet conceals the first main surface of the transparent substrate and the protecting member;
    etching the second main surface of the transparent substrate; and
    removing the anti-static sheet.

2. The method according to claim 1, wherein,
    the protecting member is formed as a hat-shaped member having a top surface;
    the anti-static sheet is stuck on a peripheral portion of the first main surface of the transparent substrate; and
    the anti-static sheet is stuck on the top surface of the hat-shaped member except the peripheral portion of the first main surface of the transparent substrate.

3. The method according to claim 2, wherein,
    a wiring pattern electrically connected to the anode and the cathode is formed on the first main surface of the transparent substrate; and
    the anti-static sheet is stuck on the first main surface of the transparent substrate so that the anti-static sheet does not contact the wiring pattern.

4. The method according to claim 1, wherein,
    a wiring pattern electrically connected to the anode and the cathode is formed on the first main surface of the transparent substrate; and
    the anti-static sheet is stuck on the first main surface of the transparent substrate so that the anti-static sheet does not contact the wiring pattern.

5. The method according to claim 1, wherein,
    the protection member comprises a plurality of protection members; and
    the anti-static sheet is stuck on top surfaces of the protection members so that the anti-static sheet does not contact the first main surface of the transparent substrate between adjacent two of the protection members.

6. The method according to claim 1, wherein the transparent substrate is formed of a glass.

7. The method according to claim 1, wherein the anti-static sheet comprises a base sheet and an anti-static material containing a conductive filler applied to the base sheet.

* * * * *